TRANSCEIVER WITH TUNABLE PHASE LOCKED OSCILLATOR AND TUNING VOLTAGE GENERATOR
Filed Nov. 16, 1966
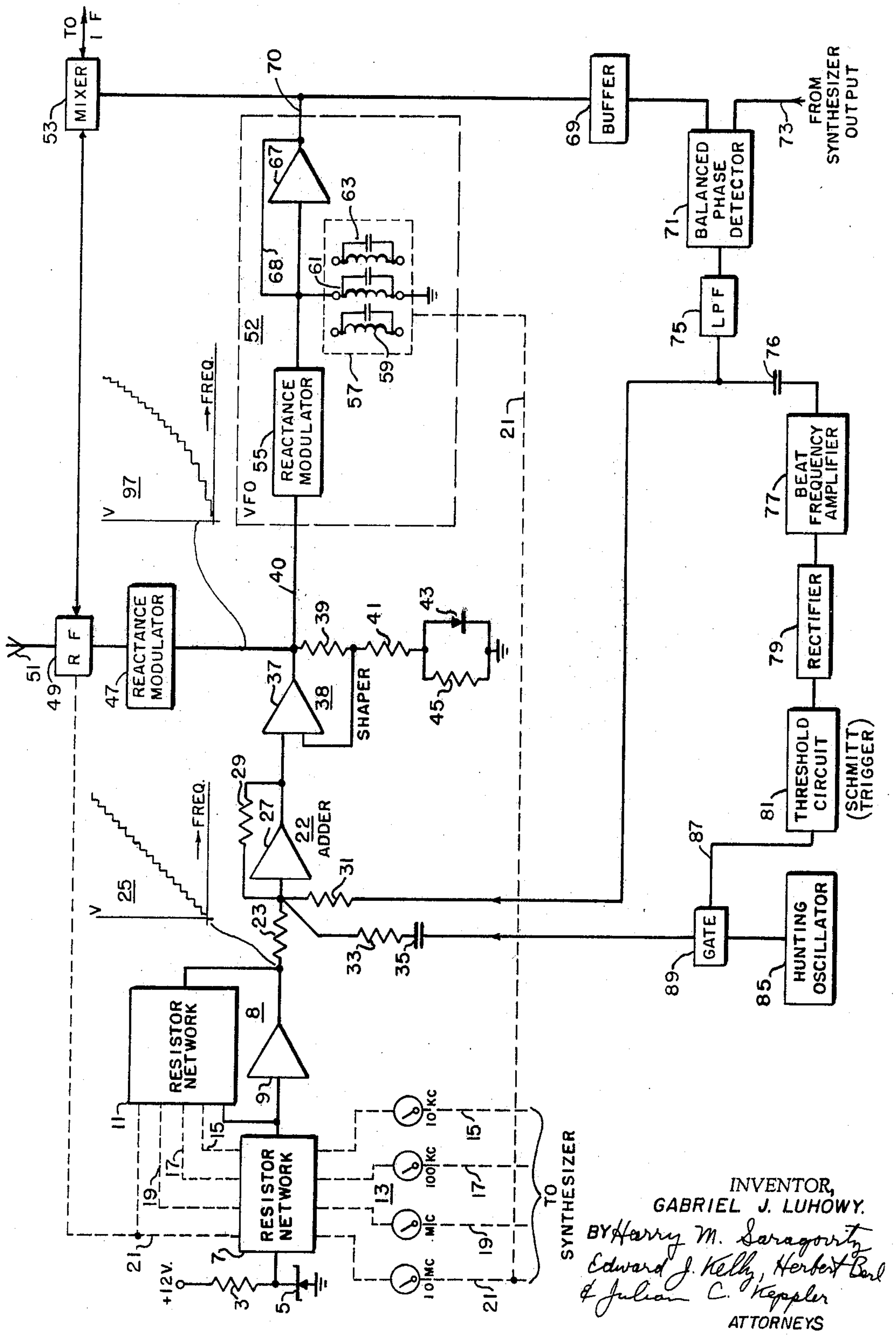
INVENTOR,
GABRIEL J. LUHOWY.
BY Harry M. Saragovitz
Edward J. Kelly, Herbert Berl
& Julian C. Keppler
ATTORNEYS United States Patent Office 3,487,311

Patented Dec. 30, 1969

3,487,311

TRANSCEIVER WITH TUNABLE PHASE LOCKED OSCILLATOR AND TUNING VOLTAGE GENERATOR

Gabriel J. Luhowy, Lima, N.Y., assignor to the United States of America as represented by the Secretary of the Army Filed Nov. 16, 1966, Ser. No. 595,315
Int. Cl. H04b 7/00
U.S. Cl. 325—17 5 Claims

ABSTRACT OF THE DISCLOSURE

The local oscillator stage of this transceiver can be phase locked to any one of a wide band of frequencies applied thereto from a digitally tunable frequency synthesizer. The oscillator is coarse tuned by the same mechanism which tunes the synthesizer. The oscillator and the synthesizer outputs are applied to a phase detector, the output of which controls a reactance modulator which fine tunes the oscillator. A radio frequency stage is gang-tuned with the local oscillator.

The present invention relates to a tunable or variable frequency oscillator which is adapted to be phase locked to a selected one of a wide band of frequencies applied thereto, which frequencies comprise the output of a tunable frequency synthesizer. The circuitry includes means, operated by the same mechanism which tunes the synthesizer, for tuning the oscillator approximately to the synthesizer output frequency and further means for comparing the phase of the oscillator output with that of the synthesizer and for automatically adjusting the frequency of the oscillator until the phase error is constant and a minimum, at which point the two frequencies will be the same. In the embodiment of the invention to be described, the circuitry forms part of a digitally-tuned superhetrodyne transceiver in which the tunable phase locked oscillator output is utilized as a local oscillator signal and in which the coarse tuning means for said oscillator are actuated by a plurality of manually-operated, decimally-related tuning knobs which also tune the synthesizer and the radio frequency stages of the transceiver. The error signal in the phase control loop of the oscillator is also utilized to fine-tune the radio frequency stages of the transceiver to a frequency which differs from the oscillator tuning by the transceiver intermediate frequency. The phase control loop includes a non-linear amplifier or shaper which renders the phase error voltage therein a non-linear function of the setting of the manually-operated tuning knobs. This compensates for the non-linear voltage vs. tuning characteristic of the reactance modulators which tune the radio frequency stages and the oscillator. Further, the circuitry includes a hunting oscillator which inserts an alternating current signal into the phase control loop whenever the phase detector thereof has an alternating or beat frequency output which is indicative of a frequency error between the variable frequncy oscillator and synthesizer outputs. This AC signal sweeps the tuning of the variable frequency oscillator (VFO) around the frequency to which it is set by the coarse tuning means. When the variable frequency oscillator tuning reaches that of the synthesizer, the hunting oscillator is automatically disabled and the phase control loop then takes over to maintain the VFO at the synthesizer frequency.

It is thus an object of the invention to provide a novel and useful tunable phase locked oscillator and tuning voltage generator.

Another object of the invention is to provide a variable frequency oscillator which can be phase locked to any one of a wide band of frequencies and which is also adapted to provide direct current tuning voltages.

A further object of the invention is to provide an oscillator capable of being phase locked to any one of a plurality of decimally spaced frequencies, thereby providing decimally spaced local oscillator injection signals for a transceiver and further providing direct current tuning voltages for the tuning of the radio frequency stages of said transceiver.

Another object is to provide an improved tuning system for a wide-band transceiver.

These and other objects and advantages of the invention will become apparent from the following detailed description and drawing, the sole figure of which is a block diagram of an illustrative embodiment of the invention.

In the drawing, the coarse tuning voltage generator 8 includes a resistor 3 and Zener diode 5 serially connected across a 12 volt battery to provide a regulated or constant voltage at the junction of these two circuit elements. This regulated DC voltage is applied to a first precision resistor network 7, the output of which is applied to operational amplifier 9. Amplifier 9 includes in its feedback loop a second precision resistor network 11. Both networks 7 and 11 are adjustable in step fashion to decimally-related values of resistance by means of the decade-type, manually-operable tuning knobs 13. Illustratively, the most significant tuning knob may tune the transceiver in steps of 10 mc., the next most significant in steps of 1 mc., the next in steps of 100 kc. and the least significant in steps of 10 kc. Each of the ten position tuning knobs 13 are linked to both the resistor networks 7 and 11, as indicated by the mechanical connections 15, 17, 19 and 21. Network 7 determines the percentage of the regulated voltage across diode 5 which is applied to the input of amplifier 9 and network 7 controls the feedback factor and hence the gain of amplifier 8, thus the elements 7, 9, and 11 together comprise a decade-type attenuator for producing a step-type coarse tuning voltage related to the setting of the knobs 13, as illustrated by curve 25. All of the tuning knob linkages are also connected to the synthesizer (not shown) and are arranged to produce an output frequency therefrom which differs from the setting of the knobs 13 by the transceiver intermediate frequency. The synthesizer is a complex, digitally tuned signal generator, the details of which are unimportant to the present invention, and need not be described. It should be noted however that the synthesizer output comprises a desired frequency component, determined by the transceiver tuning, plus numerous undesired sidebands of lower amplitude. These undesired sidebands would cause interference if the synthesizer output were directly injected into the transceiver mixer 53, as the local oscillator signal. By phase locking a variable frequency oscillator with the dominant component of the synthesizer output and using the VFO output as the local oscillator signal, the undesired sidebands are attenuated and further the phase control voltage of the VFO can be used to gang-tune other stages of the transceiver.

The variable frequency oscillator 52 is illustrated as an amplifier 67 with a tank circuit 61 common to its input and output. The VFO is coarse tuned by two means. One is the turret 57 which carries a plurality of tank circuits, three of which, 59, 61, and 63 are illustrated, which may be selectively connected to the VFO tank circuit in accordance with the setting of the 10 mc. tuning knob, as indicated by the mechanical linkage 21. The VFO tank circuit has connected thereto a reactance modulator 55 which varies the VFO tuning in accordance with a control voltage applied thereto via lead 40. The reactance modulator may comprise a varactor diode. The output of the coarse tuning voltage generator 8 is injected into the VFO phase control loop via the resistor 23 which is connected to form one input of adder 22. The adder includes an amplifier 27 with a feedback resistor 29 connected from its output to its input. The adder output is then applied to the reactance modulator 55 via shaper 38, the function of which was mentioned above. The shaper includes an amplifier 37 with negative feedback and with a nonlinear network comprising resistors 41 and 45 and diode 43 shunting its feedback path. The curve 97 shows how the shaper output voltage varies nonlinearly with the frequency setting of the decade-type tuning knobs 13. The exact mode of operation of the shaper 38 is disclosed in a co-pending application of the present inventor and Richard H. Moehlmann, Ser. No. 564,436, filed on July 11, 1966. It is sufficient however for present purpose to understand that the shaper comprises a nonlinear translating means inserted in the VFO phase control loop for achieving a desired distortion of the voltage therein. The output of the coarse tuning voltage generator, applied to the reactance modulator 55 via the adder 22 and shaper 38, comprises the second means for coarse tuning the VFO.

The output 70 of the VFO is applied to the transceiver mixer 53 as the local oscillator signal thereof and is also applied to one input of phase detector 71 via buffer amplifier 69. The other input of the phase detector is the output 73 of the synthesizer. The phase detector output is applied to low pass filter 75, the alternating current output of which is applied to beat frequency amplifier 77 via DC blocking capacitor 76 and also to the input of adder 22 via resistor 31. The output of amplifier 77 is detected or rectified by rectifier 79. The output of rectifier 79 controls the operation of threshold circuit 81, which may take the form of a Schmitt trigger. Threshold circuit 81 is a bistable device which assumes a first stable state if the output of rectifier 79 exceeds a given threshold voltage and assumes a second stable state if the output of 79 is below the threshold voltage. The output of the threshold circuit is applied as a control voltage over lead 87 to gate 89. The gate 89 is connected between the output of hunting oscillator 85 and the input of adder 22. In the first stable state of circuit 81, the voltage on lead 87 is of such amplitude and polarity that gate 89 opens, thus applying the output of the hunting oscillator to the input of adder 22 via DC blocking capacitor 35 and resistor 33. If the threshold circuit is in its second stable state, the voltage on lead 87 will be such that the gate 89 will be closed. The alternating current output of the hunting oscillator may be a sawtooth wave in the audio frequency range.

The radio frequency circuits 49 are tuned in a similar manner to the VFO 52, by means of linkage 21, operated by the most significant or 10 mc. tuning knob, which actuates a turret tuner (not shown) similar to the turret 57 and also by reactance modulator 47, which is controlled by the same voltage from lead 40 which controls the VFO reactance modulator 55. The output of radio frequency circuits 49 is applied to mixer 53 as the signal input thereof. The mixer output is applied to the intermediate frequency channel of the transceiver, not shown. When in the transmit mode, the signal path in the IF channel, in the RF amplifier and antenna would be reversed, as indicated by the double-headed arrows.

In operation, the four decade-type tuning switches 13 are set to a desired frequency. This produces a dominant output frequency from the synthesizer which differs from the setting of the knobs 13 by precisely the transceiver intermediate frequency. This frequency is applied to the phase detector 71 via lead 73. Simultaneously, the turret 57 and the similar turret in the radio frequency circuits 49, operated by the 10 mc. tuning knob, and the output of the coarse tuning voltage generator, determined conjointly by the settings of all the tuning knobs 13, coarse tune the radio frequency circuits to the desired frequency and coarse tune the VFO to the dominant synthesizer frequency. In the event that the coarse tuning of the VFO differs from the synthesizer frequency, which is usually the case, the phase detector 71 will have a beat frequency in its output equal to the frequency difference between its inputs. The low pass filter 75 has a cutoff frequency which is between the lowest possible output frequency or the synthesizer and largest expected beat frequency. Thus this filter will pass the beat frequencies in the phase detector output to beat frequency amplifier 77 but will block all possible output frequencies of both the VFO and synthesizer. The beat frequency is amplified by 77, converted to direct current by rectifier 79 and applied to threshold circuit 81 to switch this circuit to its first stable state, thereby opening gate 89 and connecting the hunting oscillator output to the input of adder 22. Since the output of oscillator 85 is inserted in the phase control loop via adder 22, it sweeps the VFO tuning around the value set by the two coarse tuning means. When the VFO frequency has been thus swept to that of the dominant frequency in the synthesizer output, the beat frequency output of the phase detector will disappear and be replaced by a DC voltage proportioned to the phase difference between its two inputs. The VFO and synthesizer frequencies will then be the same. The lack of the beat frequency causes the output of the rectifier 79 to disappear, thereby switching threshold circuit 81 to its second stable state, closing gate 89 and thus removing the sawtooth voltage from the phase control loop. The DC output of the phase detector applied through the filter 75, resistor 31, adder 22, and shaper 38 to both reactance modulators 55 and 47 provides a fine tuning voltage, in addition to the coarse tuning voltage provided by generator 8, the combined tuning voltages tuning the VPO exactly to the dominant output of the synthesizer and the radio frequency circuits precisely to the setting of the tuning knobs 13.

While the illustrative circuitry shows the coarse tuning means comprising the turrets of the VFO and radio frequency circuits as operated only by the most significant or 10 mc. tuning knob, design considerations may require that these turrets be conjointly controlled by two of the more significant tuning knobs, for instance by both the 10 mc. and 1 mc. tuning knobs. Further, the phase locked oscillator has been illustrated or being tunable in steps which are decimally related, however it is obvious that the same circuitry could be continuously tunable to any frequency within its frequency range. Also, a greater or lesser number of tuning knobs may be provided if it is desired to tune the transceiver in larger or smaller steps.

Since the inventive concepts disclosed herein are of general application and are not limited to the disclosed embodiment of the invention, the invention should be limited only by the scope of the appended claims.

What is claimed is:

1. A transceiver comprising a tunable oscillator and tuning votage generator which is adapted to be phase locked to a selected one of a wide band of frequencies applied thereto, said tunable oscillator and tuning voltage generator comprising means for coarse tuning said oscillator to said selected one of said wide band of frequencies, said tunable oscillator including a phase control loop, said loop including a phase detector for comparing the phases of the output of said tunable oscillator and said selected one of said wide band of frequencies, a low pass filter connected to the output of said phase detector, the output of said low pass filter coupled to a reactance modulator which forms part of the tank circuit of said tunable oscillator, and means responsive to alternating current output from said low pass filter to inject an alternating current voltage into said phase control loop, thereby sweeping the tuning of said tunable oscillator around the value determined by said means for coarse tuning said oscillator; said transceiver further comprising radio frequency stages and a mixer and wherein the output of said oscillator is connected to said mixer as the local oscillator signal thereof and wherein the voltage in said phase control loop is applied to said radio frequency stages for gang tuning said stages with the tuning of said oscillator.

2. The circuitry of claim 1 wherein said low pass filter has a cutoff frequency such that beat frequencies between the output of said tunable oscillator and said selected one of said wide band of frequencies are passed thereby and higher frequencies blocked thereby.

3. The circuitry of claim 1 wherein said means for coarse tuning comprises a coarse tuning voltage generator which produces a direct current voltage determined by the settings of a plurality of decimally-related tuning knobs, the output of said generator being injected into the phase control loop of said oscillator, said means for coarse tuning further comprising means operated by at least one of the more significant of said plurality of decimally-related tuning knobs for connecting various tank circuits of different resonant frequency to said oscillator.

4. The circuitry of claim 3 wherein the settings of said plurality of tuning knobs determines which one of said wide band of frequencies is selected for application to said phase detector.

5. The transceiver of claim 1, wherein said means responsive to alternating current output from said low pass filter comprises a beat frequency amplifier connected to the output of said low pass filter, a rectifier connected to the output of said beat frequency amplifier, Schmitt trigger circuit connected to the output of said rectifier, a hunting oscillator having its output connected to said phase control loop via a gate circuit, the opeartion of said gate circuit being controlled by the state of said Schmitt trigger circuit.

References Cited

UNITED STATES PATENTS 2,777,064 1/1957 Robinson ------------- 331—4
2,956,239 10/1960 Hugenholtz ----------- 331—4

JOHN W. CALDWELL, Primary Examiner

A. J. MAYER, Assistant Examiner

U.S. Cl. X.R.

325—25, 422; 331—4